(12) United States Patent
Wright et al.

(10) Patent No.: US 7,181,710 B2
(45) Date of Patent: Feb. 20, 2007

(54) DEVICE FOR ESTIMATING CELL DELAY FROM A TABLE WITH ADDED VOLTAGE SWING

(75) Inventors: Brad Wright, Fort Collins, CO (US); Timothy McGonagle, Fort Collins, CO (US); Gregory Shusta, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 88 days.

(21) Appl. No.: 10/879,768

(22) Filed: Jun. 28, 2004

(65) Prior Publication Data

US 2005/0289491 A1 Dec. 29, 2005

(51) Int. Cl.
*G06F 17/50* (2006.01)
(52) U.S. Cl. ............................................... 716/6
(58) Field of Classification Search .................... 716/6, 716/2, 5; 703/13
See application file for complete search history.

(56) References Cited

U.S. PATENT DOCUMENTS

| | | | | |
|---|---|---|---|---|
| 4,896,207 A * | 1/1990 | Parulski | .......... | 348/242 |
| 4,924,430 A * | 5/1990 | Zasio et al. | .......... | 716/6 |
| 5,130,564 A * | 7/1992 | Sin | .......... | 327/264 |
| 5,568,395 A * | 10/1996 | Huang | .......... | 716/4 |
| 5,617,325 A * | 4/1997 | Schaefer | .......... | 716/6 |
| 5,636,130 A * | 6/1997 | Salem et al. | .......... | 716/6 |
| 6,028,995 A * | 2/2000 | Jetton et al. | .......... | 703/19 |
| 6,304,998 B1 * | 10/2001 | Kamiya et al. | .......... | 716/4 |
| 6,532,576 B1 * | 3/2003 | Mbouombouo et al. | .......... | 716/6 |
| 6,751,579 B1 * | 6/2004 | Misheloff et al. | .......... | 703/2 |
| 6,760,895 B2 * | 7/2004 | Ito et al. | .......... | 716/10 |
| 6,807,659 B2 * | 10/2004 | Alpert et al. | .......... | 716/6 |
| 6,820,048 B1 * | 11/2004 | Bhutani et al. | .......... | 703/15 |
| 6,880,142 B2 * | 4/2005 | Cui et al. | .......... | 716/6 |
| 7,111,261 B2 * | 9/2006 | Jones | .......... | 716/6 |
| 2002/0077799 A1 * | 6/2002 | Komoda et al. | .......... | 703/19 |
| 2003/0025712 A1 * | 2/2003 | Corr | .......... | 345/606 |
| 2003/0200517 A1 * | 10/2003 | Jones | .......... | 716/6 |
| 2004/0078765 A1 * | 4/2004 | Cui et al. | .......... | 716/6 |
| 2005/0278671 A1 * | 12/2005 | Verghese et al. | .......... | 716/6 |

* cited by examiner

*Primary Examiner*—Jack Chiang
*Assistant Examiner*—Suchin Parihar
(74) *Attorney, Agent, or Firm*—Eric James Whitesell

(57) ABSTRACT

A method and computer program for estimating a cell delay for an integrated circuit design include steps of selecting a range of values for cell ramptime and load and a range of values for an additional cell parameter. The values for cell ramptime, load, and the additional cell parameter are arranged in a lookup table. A cell delay is calculated for each combination of cell ramptime, load, and the additional cell parameter for the lookup table.

10 Claims, 3 Drawing Sheets

| Process | Temp | Voltage Swing | tpdlh | tpdhl |
|---|---|---|---|---|
| WNWP | 125 | 310mv | 0.81ns | 0.80ns |
| WNWP | 125 | 500mv | 0.74ns | 0.76ns |
| WNWP | 125 | 700mv | 0.73ns | 0.76ns |
| WNWP | 125 | 1.0 v | 0.63ns | 0.61ns |

FIG._1

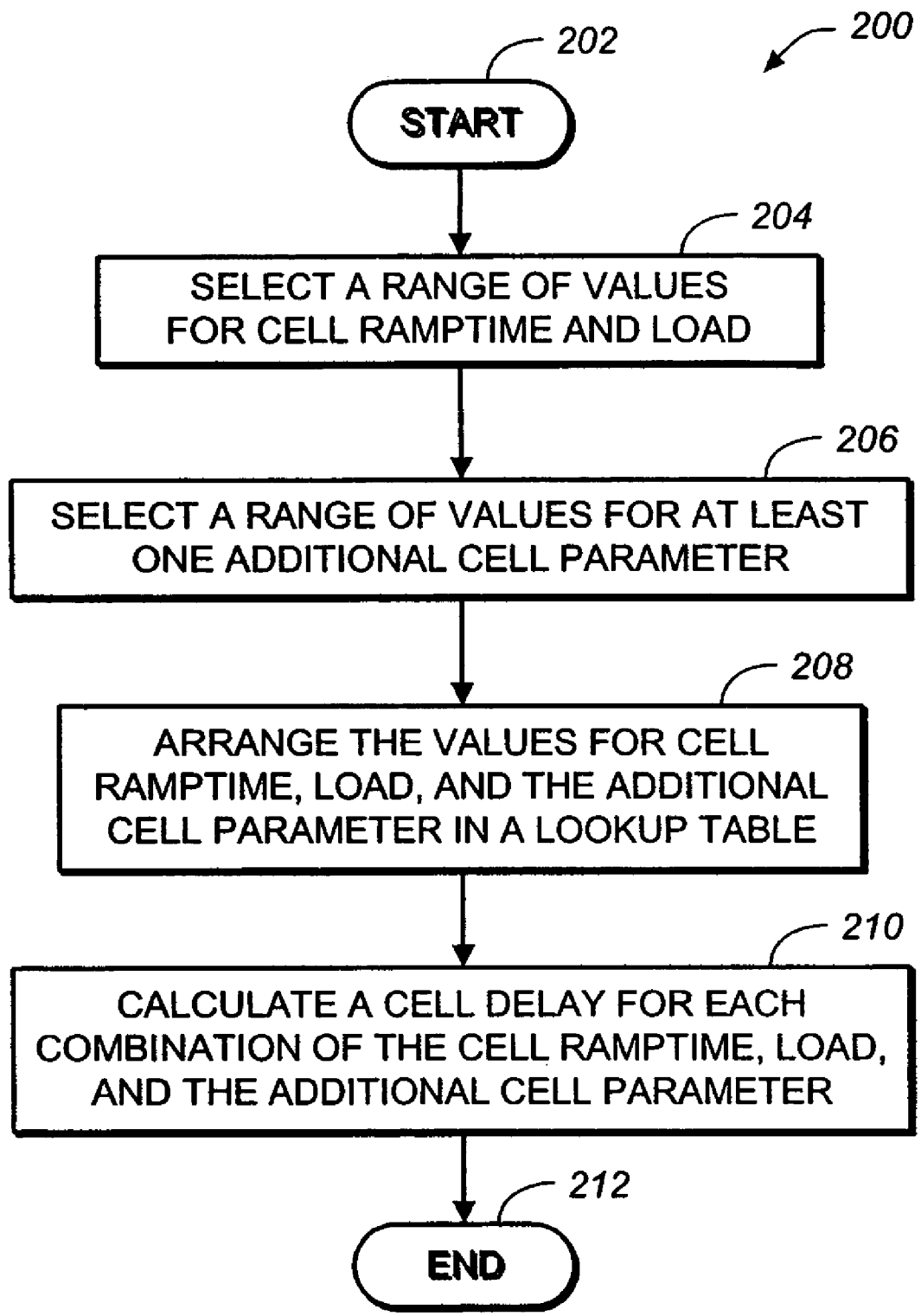
FIG._2

RAMPTIME  LOAD  PARAMETER

| |
|---|
| $F$ (6 ns, 50 ff, 300 mV) |
| $F$ (6 ns, 50 ff, 400 mV) |
| $F$ (6 ns, 60 ff, 300 mV) |
| $F$ (6 ns, 60 ff, 400 mV) |
| $F$ (6.5 ns, 50 ff, 300 mV) |
| $F$ (6.5 ns, 50 ff, 400 mV) |
| $F$ (6.5 ns, 60 ff, 300 mV) |
| $F$ (6.5 ns, 60 ff, 400 mV) |

TABLE 1

FIG. 3

DEVICE FOR ESTIMATING CELL DELAY FROM A TABLE WITH ADDED VOLTAGE SWING

BACKGROUND OF THE INVENTION

1. Field of the Invention

The present invention is directed to the design of integrated circuits. More specifically, but without limitation thereto, the present invention is directed to computer algorithms for predicting cell delays in integrated circuit designs.

2. Description of Related Art

To verify the performance of an integrated circuit design, the cell delays in each net of the integrated circuit design are typically estimated during the early design stages and also during floorplanning and routing. A timing closure is performed for the estimated cell delays to detect improper timing relationships among the cells in the integrated circuit design. Corrections are then made to the integrated circuit design, and the timing closure is repeated until all the timing errors have been corrected.

SUMMARY OF THE INVENTION

In one embodiment of the present invention, a method of estimating a cell delay for an integrated circuit design includes steps of selecting a range of values for cell ramptime and load and a range of values for an additional cell parameter. The values for cell ramptime, load, and the additional cell parameter are arranged in a lookup table. A cell delay is calculated for each combination of cell ramptime, load, and the additional cell parameter for the lookup table.

In another embodiment of the present invention, a computer program product for estimating a cell delay for an integrated circuit design includes a medium for embodying a computer program for input to a computer and a computer program embodied in the medium for causing the computer to perform steps of selecting a range of values for cell ramptime and load and a range of values for an additional cell parameter. The values for cell ramptime, load, and the additional cell parameter are arranged in a lookup table. A cell delay is calculated for each combination of cell ramptime, load, and the additional cell parameter for the lookup table.

BRIEF DESCRIPTION OF THE DRAWINGS

The present invention is illustrated by way of example and not limitation in the accompanying figures, in which like references indicate similar elements throughout the several views of the drawings, and in which:

FIG. 1 illustrates a lookup table of input voltage swing versus cell delay for a DDR-SDRAM cell according to an embodiment of the present invention;

FIG. 2 illustrates a flow chart of a method of estimating cell delay for an integrated circuit design according to an embodiment of the present invention; and FIG. 3 illustrates a lookup table of cell ramptime, load, and an additional parameter generated from the method of FIG. 2.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DETAILED DESCRIPTION OF THE ILLUSTRATED EMBODIMENTS

Integrated circuit design software includes cell delay timing calculators that use a cell delay lookup table. The lookup table contains an array of pre-calculated delays and corresponding values for cell ramptime and load of an integrated circuit cell, such as a buffer or a logic gate. Typically, the two data points in the cell delay lookup table that most closely approximate the values of the cell ramptime and load are found in the lookup table. The cell delay is calculated by interpolating between the corresponding values of the cell delay retrieved from the lookup table for the two data points. Using a lookup table to determine cell delays instead of repeated calls to a simulation program such as SPICE to calculate each cell delay results in a substantial savings in computation time required to verify timing in the integrated circuit design.

A disadvantage of previous methods for finding cell delay from a cell delay lookup table is that the precalculated values of cell delay are made on the assumption that the input signal voltage swing is a rail-to-rail signal, that is, the input signal switches between the minimum voltage level of the chip power supply and the maximum voltage level of the chip power supply. While this assumption is approximately true for slower speed digital circuit designs, the higher speeds of recent digital circuit designs result in input signal waveforms that are analog in nature, that is, the input signals switch between voltage levels that are less than rail-to-rail.

Also, complex I/O (input and output) interface cells frequently operate from signals that are not correlated with the chip power voltage levels. Examples of such signals are input signals and reference voltages that may be generated from a source off-chip.

Input signals in high-speed integrated circuit designs typically have a range, or voltage swing, that may vary depending on the termination scheme, the type of driving cells that generate the input signals, and the input signal stream. Depending on the specification, an I/O line may be terminated in various ways, for example, to VDDIO/2. In this arrangement, a resistor is tied to VDDIO/2 at the termination point so that if the I/O line is not being driven, then the I/O line voltage is equal to VDDIO/2. Pulling the I/O line to the center of the voltage rails requires power, however. Consequently, a higher power is required to pull away from the center point, which may reduce the voltage swings from the center point of VDDIO/2 so that the voltage swings of the input signal are not rail to-rail. If the input signal voltage swing is less than the rail-to-rail voltage, then the values of cell delay in the cell delay lookup table that were generated on the assumption that the input signal voltage swing is a rail-to-rail signal may be inaccurate. For example, the input signal to a double data rate (DDR) synchronous dynamic random access memory (SDRAM) with stub series terminated logic (SSTL) may have a voltage swing of from 310 mV to the full rail-to-rail voltage of 1.0 V. Selecting only the rail-to-rail value for the input signal voltage swing to estimate cell delay from the lookup table may result in a circuit design that fails to meet performance specifications.

A voltage reference signal is typically used to drive cells having single-ended differential inputs. Although the reference voltage directly impacts cell delay, the reference voltage may be independent of the voltage value used in the calculations for cell delay.

Typically, the problem of estimating cell delay under different operating conditions is solved by bracketing the cell delay between extreme values, called worst case and best case values. A disadvantage of using this approach for all possible values of input signal voltage swing is that only one value of input signal voltage swing may be applicable to a specific application. Using the worst case/best case method to account for the entire range of possible values of input signal voltage swing may therefore place unnecessarily severe constraints on the circuit design. As a result, timing closure for the integrated circuit design may be made more difficult or even impossible using the worst case/best case method.

For complex cells having analog content, that is, an input signal voltage swing that is less than rail-to-rail, previous cell delay lookup tables may not be adequate to ensure a successful circuit design.

In accordance with an aspect of the present invention, a more accurate estimate of cell delay is achieved by including an additional dimension, or axis, to the structure of a standard cell delay lookup table for at least one additional parameter, for example, input voltage swing. In one embodiment, a method of calculating a cell delay for an integrated circuit design includes steps of:

(a) selecting a range of values for cell ramptime and load;
(b) selecting a range of values for an additional cell parameter;
(c) arranging the values for cell ramptime, load, and the additional cell parameter in a lookup table; and
(d) calculating a cell delay for each combination of cell ramptime, load, and the additional cell parameter for the lookup table.

A cell delay lookup table in accordance with an embodiment of the present invention may be constructed from a standard lookup table by adding a range of values for an additional cell parameter for each combination of values for cell ramptime and load. For example, for each of the existing values for cell ramptime and load in a standard lookup table, cell delays corresponding to the input signal voltage swing values of 310 mV, 500 mV and 700 mV may be calculated using SPICE or another suitable circuit emulation program in the same manner used to calculate the rail-to-rail voltage swing.

FIG. 1 illustrates a lookup table of input voltage swing versus cell delay for a DDR-SDRAM cell according to an embodiment of the present invention. Shown in FIG. 1 are values of cell delay for different values of input signal voltage swing for transitions from high-to-low (tpdhl) and low-to-high (tpdlh) for a load of 32 standard loads=32*3.04ff. As may be appreciated from FIG. 1, the cell delay is greater for the minimum voltage swing of 310 mV than for the full rail-to-rail voltage swing of 1.0 V by a factor of 0.80/0.61=133 percent. A table such as that illustrated in FIG. 1 may be generated using a circuit simulation program according to well-known techniques for each combination of values for cell ramptime, load, and input voltage swing to generate an augmented cell delay lookup table.

The estimated cell delay may be found from the augmented cell delay lookup table in the same manner used for a standard cell delay lookup table. The values for the input voltage swing corresponding to the pair of values for the cell ramptime and load may then be searched to find the closest value approximating the input voltage swing for a specific cell in the circuit design. The corresponding value of the estimated cell delay from the lookup table is then more likely to match the actual value of cell delay in the circuit design than would be possible using the simple assumption of the standard rail-to-rail input voltage swing. The modification of a standard cell delay lookup table to include an additional parameter such as input voltage range in addition to that of cell ramptime and load is an important feature of the present invention.

The modified cell delay lookup table of the present invention may be searched in the same manner as a standard cell delay lookup table, with the additional step of searching the values of the additional cell parameter corresponding to the selected values of cell ramptime and load to find the estimated cell delay.

In other embodiments of the present invention, the additional cell parameter is a reference voltage. A cell having a single-ended differential input operates from a reference voltage that may be generated on-chip or off-chip. Depending on the circuit design, the reference voltage may vary independently from the power supply voltages on-chip. A range of values for reference voltage may be included in a cell delay lookup table for each pair of cell ramptime and load values to improve the accuracy of the estimated cell delay.

In further embodiments of the present invention, a cell delay lookup table may be constructed with one or more additional cell parameters to further improve the accuracy of the estimated cell delay. For example, differential receivers, such as a differential comparator, receive two complementary signals on separate lines. Differential signals have excellent noise rejection and typically use small voltage swings that are well suited to high frequency applications. Ideally, the complementary signals cross over at a voltage level of precisely VDDIO/2. However, the signals may be skewed relative to each other due to routing imbalances, resulting in an offset voltage. The offset voltage may be used in the cell delay lookup table as an additional cell parameter in the same manner as voltage swing and voltage reference level to further improve the accuracy of the estimated cell delay.

In other applications, one end of the differential amplifier is tied to a static voltage Vref. In this arrangement, the gain is less than that for true differential signals, however the zero crossing point may be adjusted simply by adjusting the value of Vref.

FIG. 2 illustrates a flow chart 200 of a method of estimating cell delay for an integrated circuit design according to an embodiment of the present invention.

Step 202 is the entry point of the flow chart 600.

In step 204, a range of values for cell ramptime and load is selected that includes the possible values expected for an integrated circuit design.

In step 206, a range of values for at least one additional cell parameter is selected. The additional cell parameter may be, for example, input voltage swing, a reference voltage, or an offset voltage of a differential signal.

In step 208, the values for cell ramptime, load, and the additional cell parameter are arranged in a lookup table according to well-known techniques.

In step 210, a cell delay for each combination of the cell ramptime, load, and the additional cell parameter is calculated for the lookup table. The calculation of the cell delays may be performed, for example, in circuit simulation software such as SPICE. The number of entries in the lookup table may be reduced if desired by applying an algorithm according to well-known techniques that examines the calculated cell delays to determine whether the cell delay varies linearly between data points. Where the cell delay varies substantially linearly between data points, fewer table entries may be used; where the cell delay varies non-linearly between data points, more table entries are needed to describe the cell delay as a function of the cell ramptime, load, and the additional cell parameter.

Step 212 is the exit point of the flow chart 200.

Once the lookup table has been generated, estimated cell delays may be found during the early stages of circuit design for each cell in an integrated circuit design by searching the lookup table for a cell delay that most closely corresponds to the values of cell ramptime, load, and the additional parameter for a specific cell in an integrated circuit design to generate an estimated cell delay for the specific cell. For example, the lookup table may be searched to find the value of cell delay as a function of the cell ramptime, load, and the additional parameter that most closely approximate that of the specific cell. If the values of cell ramptime, load, and input voltage range for the specific cell are respectively 6.2 nanoseconds, 53 femtofarads, and 360 millivolts, and if the lookup table has cell ramptime values for 6.0, 6.5 and 7.0 nanoseconds, then the closest value in the lookup table for the specific cell ramptime of 6.2 nanoseconds would be 6.0 nanoseconds. If the values of the load that correspond to the entry in the lookup table for a 6.0 nanosecond delay include 40 femtofarads, 50 femtofarads and 60 femtofarads, then the closest value for the specific cell load would be 50 femtofarads. If the values of the input voltage range that correspond to the entries in the lookup table for a 6.0 nanosecond delay and a load of 50 femtofarads include 200 millivolts, 300 millivolts and 400 millivolts, then the closest value for the specific cell input voltage range would be 400 millivolts. The value of cell delay from the lookup table corresponding to the values of 6.0 nanoseconds, 50 femtofarads and 400 millivolts is then selected as the value that most closely corresponds to the values of cell ramptime, load, and input voltage range for the specific cell.

Alternatively, the lookup table may be searched for the pair of cell delays that most closely corresponds to the values of cell ramptime, load, and the additional parameter for a specific cell in an integrated circuit design. In the example above, the cell ramptime values for 6.0 and 6.5 nanoseconds are the closest values in the lookup table for the specific cell ramptime of 6.2 nanoseconds. The closest values in the lookup table for the specific cell load of 53 femtofarads are for the extracted value of the load are 50 femtofarads and 60 femtofarads. The closest values in the lookup table for the specific cell input voltage range of 360 millivolts are 300 millivolts and 400 millivolts. Accordingly, there are eight possible combinations of cell delay as a function F of cell ramptime, load, and input voltage swing as illustrated in Table 1 below and in FIG. 3.

TABLE 1

F(6 ns, 50 ff, 300 mV)
F(6 ns, 50 ff, 400 mV)
F(6 ns, 60 ff, 300 mV)
F(6 ns, 60 ff, 400 mV)
F(6.5 ns, 50 ff, 300 mV)
F(6.5 ns, 50 ff, 400 mV)
F(6.5 ns, 60 ff, 300 mV)
F(6.5 ns, 60 ff, 400 mV)

The eight values of the cell delay F may be interpolated to generate an estimated cell delay by successively weighting the values of cell ramptime, load, and the additional parameter to generate the estimated cell delay for the specific cell delay F(6.2 ns, 53 ff, 360 mV) as follows.

$$1-(6.2-6)/(6.5-6)=60 \text{ percent} \quad (1)$$

From (1), each 6 ns data point is weighted by 60 percent, and each 6.5 ns data point is weighted by 40 percent:

$$F(6.2 \text{ ns}, 50 \text{ ff}, 300 \text{ mV}) = \quad (2)$$
$$0.6 * F(6 \text{ ns}, 50 \text{ ff}, 300 \text{ mV}) + 0.4 * F(6.5 \text{ ns}, 50 \text{ ff}, 300 \text{ mV})$$

$$F(6.2 \text{ ns}, 50 \text{ ff}, 400 \text{ mV}) = \quad (3)$$
$$0.6 * F(6 \text{ ns}, 50 \text{ ff}, 400 \text{ mV}) + 0.4 * F(6.5 \text{ ns}, 50 \text{ ff}, 400 \text{ mV})$$

$$F(6.2 \text{ ns}, 60 \text{ ff}, 300 \text{ mV}) = \quad (4)$$
$$0.6 * F(6 \text{ ns}, 60 \text{ ff}, 300 \text{ mV}) + 0.4 * F(6.5 \text{ ns}, 60 \text{ ff}, 300 \text{ mV})$$

$$F(6.2 \text{ ns}, 60 \text{ ff}, 400 \text{ mV}) = \quad (5)$$
$$0.6 * F(6 \text{ ns}, 60 \text{ ff}, 400 \text{ mV}) + 0.4 * F(6.5 \text{ ns}, 60 \text{ ff}, 400 \text{ mV})$$

The eight values of cell delay have now been reduced by half to four values.

$$1-(53-50)/(60-50)=70 \text{ percent} \quad (6)$$

From (6), each 50 ff data point is weighted by 70 percent, and each 60 ff data point is weighted by 30 percent:

$$F(6.2 \text{ ns}, 53 \text{ ff}, 300 \text{ mV}) = \quad (7)$$
$$0.7 * F(6.2 \text{ ns}, 50 \text{ ff}, 300 \text{ mV}) + 0.3 * F(6.2 \text{ ns}, 50 \text{ ff}, 300 \text{ mV})$$

$$F(6.2 \text{ ns}, 53 \text{ ff}, 400 \text{ mV}) = \quad (8)$$
$$0.7 * F(6.2 \text{ ns}, 60 \text{ ff}, 400 \text{ mV}) + 0.3 * F(6.2 \text{ ns}, 60 \text{ ff}, 400 \text{ mV})$$

The four values of cell delay have now been reduced by half to two values.

$$1-(360-300)/(400-300)=40 \text{ percent} \quad (9)$$

From (9), each 300 mV data point is weighted by 40 percent, and each 400 mV data point is weighted by 60 percent:

$$F(6.2 \text{ ns}, 53 \text{ ff}, 360 \text{ mV}) = \quad (10)$$
$$0.4 * F(6.2 \text{ ns}, 53 \text{ ff}, 300 \text{ mV}) + 0.6 * F(6.2 \text{ ns}, 53 \text{ ff}, 400 \text{ mV})$$

As may be appreciated from the example above, the successive weighting reduces the number of interpolations performed by half for each iteration. The resulting estimated cell delay F(6.2 ns, 53 ff, 360 mV) includes the effect of the additional parameter, in this example, the input voltage range, advantageously refining the accuracy of the estimated value of cell delay to match the actual value.

Table 2 illustrates a lookup table for a ramptime of 1 nanosecond for a differential receiver.

TABLE 2

| VOLTAGE SWING (mV) | LH DELAY (ns) | HL DELAY (ns) |
|---|---|---|
| 300 | 0.672 | 0.620 |
| 400 | 0.635 | 0.592 |
| 500 | 0.611 | 0.570 |
| 600 | 0.589 | 0.553 |
| 700 | 0.577 | 0.541 |
| 800 | 0.565 | 0.530 |
| 900 | 0.556 | 0.520 |
| 1000 | 0.549 | 0.512 |

In the example of Table 2, the input voltage swing is relative to a reference voltage Vref. The cell delays in the second and third columns of the lookup table are calculated for low-to-high transitions (LH delay) and for high-to-low transitions (HL delay).

Although the method of the present invention illustrated by the flowchart description above is described and shown with reference to specific steps performed in a specific order, these steps may be combined, sub-divided, or reordered without departing from the scope of the claims. Unless specifically indicated herein, the order and grouping of steps is not a limitation of the present invention.

In another embodiment of the present invention, the method of FIG. 2 may be incorporated into a computer program product for estimating cell delay for an integrated circuit design that includes:

a medium for embodying a computer program for input to a computer; and a computer program embodied in the medium for causing the computer to perform steps of:
- (a) selecting a range of values for cell ramptime and load;
- (b) selecting a range of values for an additional cell parameter;
- (c) arranging the values for cell ramptime, load, and the additional cell parameter in a lookup table; and
- (d) calculating a cell delay as a function of each combination of the cell ramptime, load, and the additional cell parameter for the lookup table.

While the invention herein disclosed has been described by means of specific embodiments and applications thereof, numerous modifications and variations could be made thereto by those skilled in the art without departing from the scope of the invention set forth in the following claims.

What is claimed is:

1. A method of estimating a cell delay for an integrated circuit design comprising steps of:
   - (a) selecting a range of values for cell ramptime and load;
   - (b) selecting a range of values for an additional cell parameter;
   - (c) arranging the values for cell ramptime, load, and the additional cell parameter in a lookup table;
   - (d) calculating a cell delay as a function of each combination of the cell ramptime, load, and the additional cell parameter for the lookup table;
   - (e) searching the values for cell ramptime, load, and the additional cell parameter in the lookup table for a cell delay that most closely corresponds to the values of cell ramptime, load, and the additional cell parameter for a specific cell in an integrated circuit design;
   - (f) interpolating between only two cell delays that most closely correspond to the values of cell ramptime, load, and the additional cell parameter; and
   - (g) successively weighting the values of cell ramptime, load, and the additional cell parameter to generate an estimated cell delay for the specific cell.

2. The method of claim 1 wherein the additional cell parameter is an input voltage range.

3. The method of claim 1 wherein the additional cell parameter is a reference voltage for driving cells with single-ended differential inputs.

4. The method of claim 1 wherein the additional cell parameter is an offset voltage between differential signals.

5. The method of claim 1 wherein step (d) further comprises calculating the cell delay by circuit simulation.

6. A computer readable storage medium tangibly embodying instructions for a computer that when executed by the computer implement a method for estimating a cell delay for an integrated circuit design, the method comprising steps of:
   - (a) selecting a range of values for cell ramptime and load;
   - (b) selecting a range of values for an additional cell parameter;
   - (c) arranging the values for the cell ramptime, load, and the additional cell parameter in a lookup table;
   - (d) calculating a cell delay as a function of each combination of the cell ramptime, load, and the additional cell parameter for the lookup table;
   - (e) searching the values for cell ramptime, load, and the additional cell parameter in the lookup table for a cell delay that most closely corresponds to the values of cell ramptime, load, and the additional cell parameter for a specific cell in an integrated circuit design;
   - (f) interpolating between only two cell delays that most closely correspond to the values of cell ramptime, load, and the additional cell parameter; and
   - (g) successively weighting the values of cell ramptime, load, and the additional cell parameter to generate an estimated cell delay for the specific cell.

7. The computer program product of claim 6 wherein the additional cell parameter is an input voltage range.

8. The computer program product of claim 6 wherein the additional cell parameter is a reference voltage for driving cells with single-ended differential inputs.

9. The computer program product of claim 6 wherein the additional cell parameter is an offset voltage between differential signals.

10. The computer program product of claim 6 wherein step (d) further comprises calculating each cell delay by circuit simulation.

* * * * *